United States Patent
Schmidt

(10) Patent No.: US 10,374,496 B2
(45) Date of Patent: Aug. 6, 2019

(54) METHOD OF MOUNTING ATTACHMENT PARTS TO AN ELECTRIC MACHINE

(71) Applicant: Audi AG, Ingolstadt (DE)

(72) Inventor: Joerg Schmidt, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 201 days.

(21) Appl. No.: 15/346,188

(22) Filed: Nov. 8, 2016

(65) Prior Publication Data

US 2017/0141658 A1    May 18, 2017

(30) Foreign Application Priority Data

Nov. 18, 2015 (DE) .................... 10 2015 014 942.3

(51) Int. Cl.
| | |
|---|---|
| *H02K 15/00* | (2006.01) |
| *H02K 15/14* | (2006.01) |
| *H02K 15/16* | (2006.01) |
| *G01R 31/34* | (2006.01) |

(52) U.S. Cl.
CPC ......... *H02K 15/0006* (2013.01); *H02K 15/14* (2013.01); *G01R 31/34* (2013.01)

(58) Field of Classification Search
CPC .... H02K 15/0006; H02K 15/14; H02K 15/02; H02K 15/022; H02K 15/12; H02K 3/12; H02K 3/28
USPC ...... 29/596, 732, 598, 599; 310/46, 71, 198, 310/216.118
See application file for complete search history.

(56) References Cited

U.S. PATENT DOCUMENTS

| | | | |
|---|---|---|---|
| 3,716,912 A | 2/1973 | Vind | |
| 5,786,646 A | 7/1998 | Newberg et al. | |
| 8,552,613 B2* | 10/2013 | Stiesdal | H02K 1/187 |
| | | | 310/216.113 |
| 9,281,731 B2* | 3/2016 | Benedict | H02K 7/1838 |
| 2007/0090719 A1 | 4/2007 | Shervington et al. | |
| 2015/0145360 A1* | 5/2015 | Okada | H02K 3/50 |
| | | | 310/71 |

FOREIGN PATENT DOCUMENTS

| | | |
|---|---|---|
| CN | 103430429 A | 12/2013 |
| DE | 10 2013 109 307 A1 | 3/2015 |

(Continued)

OTHER PUBLICATIONS

European Search Report with respect to counterpart European patent application EP 16 00 2319, dated Apr. 6, 2017.

(Continued)

*Primary Examiner* — Paul D Kim
(74) *Attorney, Agent, or Firm* — Henry M. Feiereisen LLC

(57) ABSTRACT

In a method of mounting attachment parts to an electric machine, a rotor of the electric machine is non-rotatably supported in a bearing device. A stator of the electric machine is detachably secured in a predefined first installation position by a clamping device, and a first attachment part is mounted to the stator. The clamping device is then released, and the electric machine is operated as motor for a time period sufficient for the stator to rotate in relation to the rotor until reaching a second installation position. The stator is secured by the clamping device in the second installation position, and a second attachment part is mounted to the stator.

11 Claims, 3 Drawing Sheets

(56) References Cited

FOREIGN PATENT DOCUMENTS

GB          1 341 434       12/1973
WO    WO 2012/040536 A1    9/2011

OTHER PUBLICATIONS

English translation of European Search Report with respect to counterpart European patent application EP 16 00 2319, dated Apr. 6, 2017.
Chinese Search Report dated Sep. 12, 2018 with respect to counterpart Chinese patent application 201611010558.3.
Translation of Chinese Search Report dated Sep. 12, 2018 with respect to counterpart Chinese patent application 201611010558.3.

* cited by examiner

METHOD OF MOUNTING ATTACHMENT PARTS TO AN ELECTRIC MACHINE

CROSS-REFERENCES TO RELATED APPLICATIONS

This application claims the priority of German Patent Application, Ser. No. 20 2015 014 942.3, filed Nov. 18, 2015, pursuant to 35 U.S.C. 119(a)-(d), the disclosure) of which is incorporated herein by reference in its entirety as if fully set forth herein.

BACKGROUND OF THE INVENTION

The present invention relates to a method of mounting attachment parts to an electric machine.

The following discussion of related art is provided to assist the reader in understanding the advantages of the invention, and is not to be construed as an admission that this related art is prior art to this invention.

Electric machines typically include a stator and a rotor which rotates in relation to the stator. Electric machines can be operated as motor or as generator or selectively as motor and generator. Once stator, rotor, bearings, and housing parts of such electric machines have been assembled, various attachment parts, such as cooling systems, power electronics, and wiring, need to be installed. For reasons of ergonomics, efforts are underway to position the electric machine in such a way as to facilitate the installation of such attachment parts. One approach involves the use of turntables by which workpiece holders for example can be pivoted. The use of separate turntables is, however, cumbersome, inefficient, and cost-intensive.

It would therefore be desirable and advantageous to provide an improved method of mounting attachment parts to an electric machine to obviate prior art shortcomings.

SUMMARY OF THE INVENTION

According to one aspect of the present invention, a method of mounting attachment parts to an electric machine includes non-rotatably supporting a rotor of the electric machine in a bearing device, detachably securing a stator of the electric machine in a predefined first installation position by a clamping device, mounting a first attachment part to the stator, releasing the clamping device, operating the electric machine as motor for a time period sufficient for the stator to rotate in relation to the rotor until reaching a second installation position, securing the stator by the clamping device in the second installation position, and mounting a second attachment part to the stator.

The present invention resolves prior art problems by being able to set any position of the stator as its installation position in relation to the rotor so that the electric machine can be positioned in such a way that the connection direction of the attachment part is realized in the direction of its force of gravity or weight force, i.e. the attachment part can be mounted from above. This can be realized by correspondingly adjusting the time period of applying current to energize the electric machine so that the electric machine can be placed in any appropriate position. The rotor of the electric machine is hereby restrained against rotation by non-rotatably supporting the rotor of the electric machine, e.g. via the rotor shaft, and allowing the stator, when energized, i.e. when current is applied to stator windings of the stator, to rotate in relation to the rotor. When the stator has reached the desired installation position, the current feed to the stator windings is stopped to thereby fix the stator in place. The attachment part can now be mounted in this fixed installation position of the stator. There is thus no need to provide any separate turntable or other turning device to effect a pivoting of the electric machine to a wanted installation position.

According to another advantageous feature of the present invention, a function test to check operativeness of the electric machine can be executed, while the stator rotates about the rotor from the first installation position to the second installation position during operation of the electric machine. In this way, while the stator is energized to rotate to a further installation position, a final installation control is carried out by checking the function of the electric machine. In such a final installation control, the operativeness of a rotary drive, rotation direction, sensor assembly, etc. can be checked.

According to another advantageous feature of the present invention, a position of the stator can be detected by position sensors of the electric machine. Using machine-own sensors eliminates the need for use of external sensors for detection of the stator position. Of course, the stator position may also be monitored by sensors located outside of the electric machine.

According to another advantageous feature of the present invention, the stator can be secured by clamping a stator housing of the stator via the clamping device.

According to another advantageous feature of the present invention, a three-phase winding of the stator can be energized to operate the electric machine as motor. Using such a three-phase winding enables a three-phase rotating field to be generated with low frequency.

According to another advantageous feature of the present invention, the electric machine can be constructed as polyphase machine, e.g. as synchronous machine or asynchronous machine.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
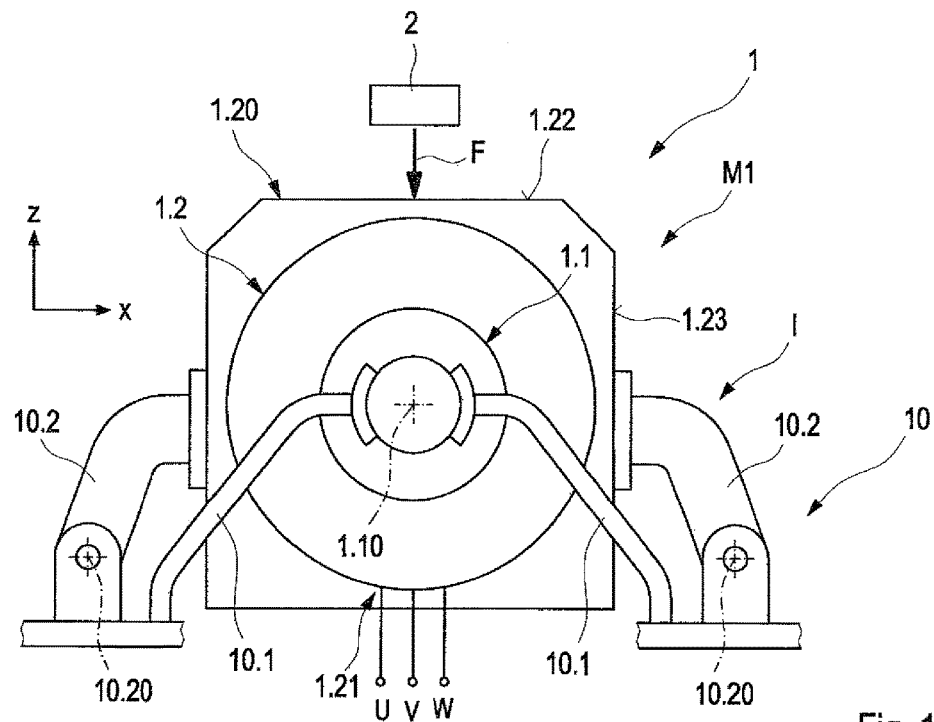
FIG. 1 is a schematic illustration of an electric machine in the form of a rotary field machine on an installation device in a predefined first installation position.

Throughout all the figures, same or corresponding elements may generally be indicated by same reference numerals. These depicted embodiments are to be understood as illustrative of the invention and not as limiting in any way. It should also be understood that the figures are not necessarily to scale and that the embodiments may be illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown a schematic illustration of an electric machine, generally designated by reference numeral 1, mounted onto an installation device, generally designated by reference numeral 10. The electric machine 1 is represented here, by way of example, as a rotary field machine which can be constructed as synchronous machine or asynchronous machine. The electric machine 1 includes a rotor 1.1, mounted on a rotor shaft 1.10, and a stator 1.2, arranged in a stator housing 1.20. The stator 1.2 includes a stator winding 1.21, configured as rotating field winding or three-phase winding so as to generate a three-phase rotating field.

The electric machine 1 is mounted onto the installation device 10 by non-rotatably connecting the rotor shaft 1.10 of the rotor 1.1 with a bearing device 10.1 of the installation device 10. As a result, the rotor 1.1 is prevented from rotating in relation to the stator 1.2, when a three-phase current is applied to the stator winding 1.21. Rather, the stator 1.2 is caused to rotate in relation to the rotor 1.1. To fix the stator 1.2 in a predefined installation position M1, the installation device 10 includes a clamping device 10.2, which has jaws to clamp the stator housing 1.20 in the predefined installation position M1 so as to prevent the stator 1.2 from rotating away from the predefined installation position M1. The jaws of the clamping device 10.2 can be pivoted about their pivot axes 10.20, as indicated by the arrows, between a clamping position I, in which the stator housing 1.20 is firmly clamped, as indicated shown in FIG. 1, and a release position II, in which the stator housing 1.20 is liberated, as indicated in FIG. 2.

In the installation position M1 of the stator 1.2, as shown in FIG. 1, an installer is able to place an attachment part 2 from above, i.e. in z direction, as indicated in FIG. 1, upon a mounting surface 1.22 of the stator housing 1.20. The connection direction, as indicated by arrow F, thus corresponds to the force of gravity or weight force of the attachment part 2. During installation, the stator housing 1.20 remains in the installation position M1 once the stator housing 1.20 is held by the clamping device 10.2 in the clamping position I.

Figure 2:
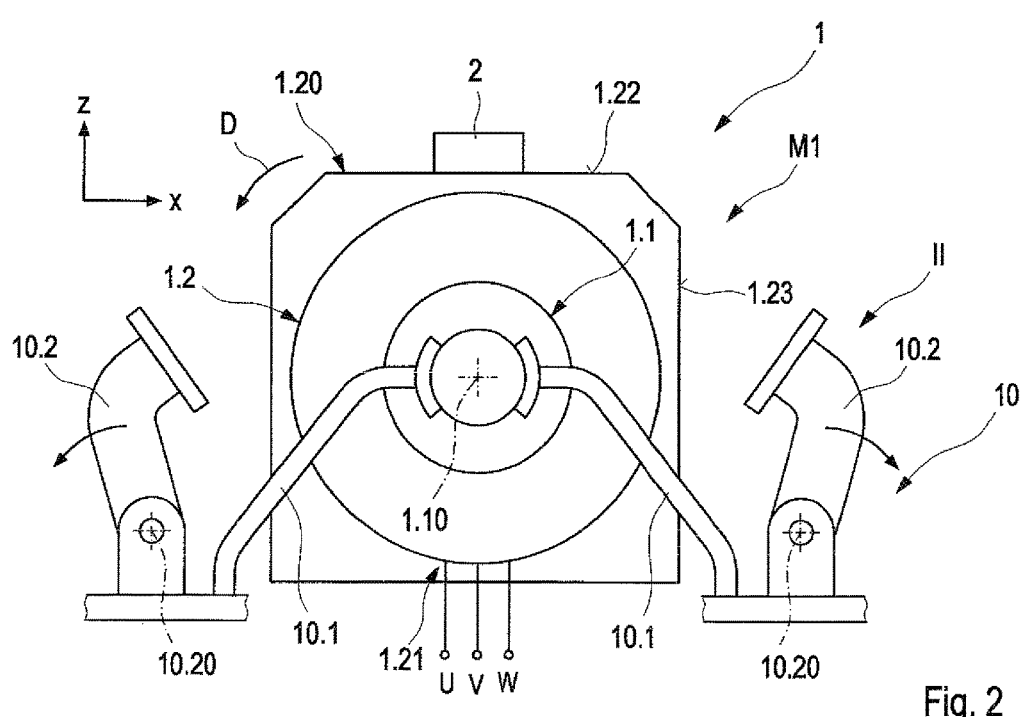
FIG. 2 is a schematic illustration of the rotary field machine of FIG. 1, depicting installation of a first attachment part onto the rotary field machine in the predefined first installation position.

Once the attachment part 2 has been mounted to the stator housing 1.20, the clamping device 10.2 is released, i.e. pivoted from clamping position I to the release position II, as shown in FIG. 2. At the same time, the stator winding 1.21 is energized with a three-phase current to cause the stator 1.2 to rotate in a rotation direction D about the rotor 1.1. For this purpose, a three-phase alternating current with low frequency of, for example, 0.5 Hz is used to realize a slow rotation speed of the stator 1.2 together with the stator housing 1.20 about the rotor 1.1.

Figure 3:
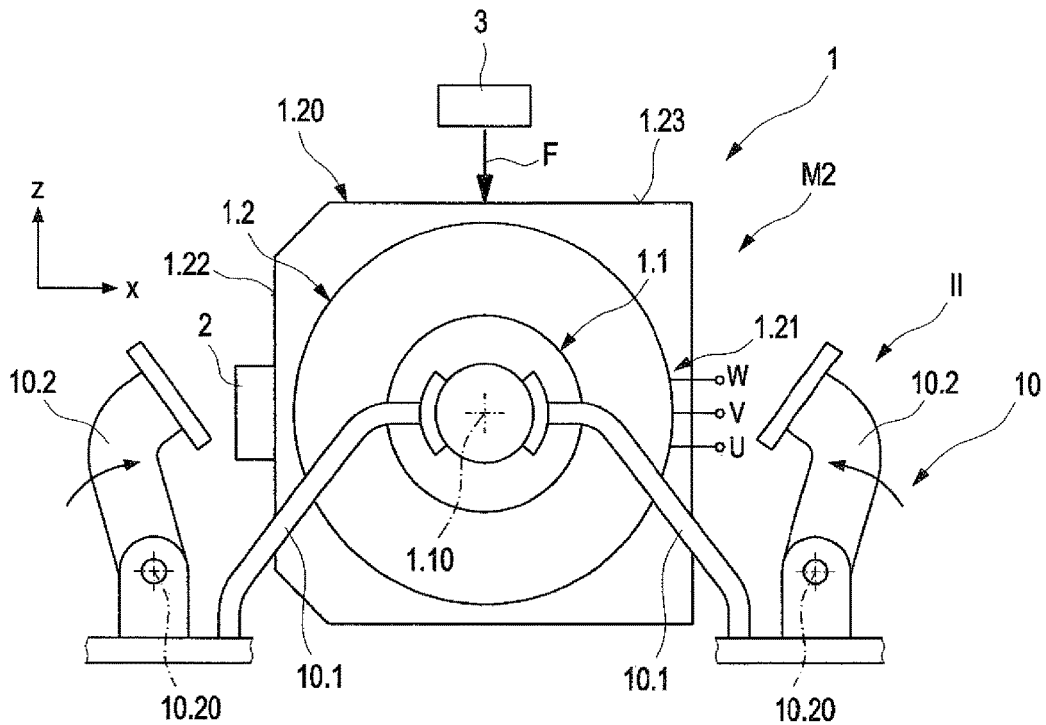
FIG. 3 is a schematic illustration of the rotary field machine of FIG. 1 in a second installation position.

Current feed to the stator winding 1.21 is stopped, when the stator 1.2 has reached a further installation position M2 which is rotated, for example, by 90° in relation to the predefined installation position M1. This is shown in FIG. 3. Also in this further installation position M2, the installer can mount a further attachment part 3 onto a further mounting surface 1.23 from above, i.e. again in z direction. The connection direction F again corresponds to the force of gravity or weight force now of the attachment part 3.

Figure 4:
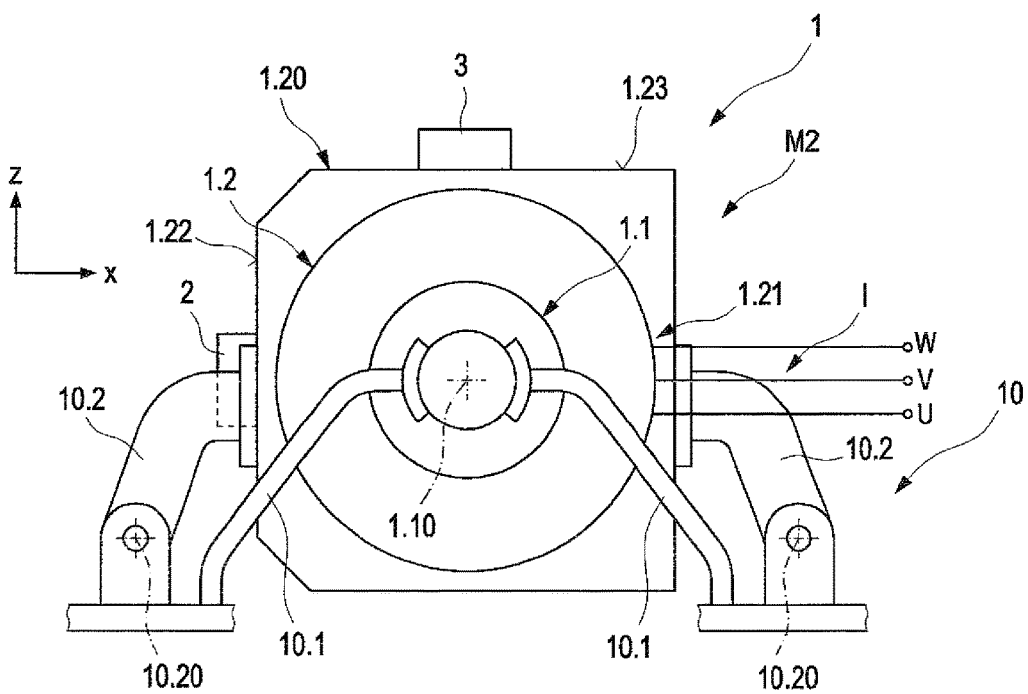
FIG. 4 is a schematic illustration of the rotary field machine of FIG. 3, depicting installation of a second attachment part onto the rotary field machine in the second installation position.

When the stator 1.2 has reached the further installation position M2, the clamping device 10.2 is pivoted into the clamping position I, as shown in FIG. 4. As a result, the stator housing 1.20 is securely clamped in the further installation position M2, and the installer is now able to mount the further attachment part 3 to the stator housing 1.20. FIG. 4 shows the electric machine 1 with the installed attachment part 3.

The position that is assumed by the stator 1.2 as the stator winding 1.21 is energized, is monitored by sensors (FIG. 5) of the electric machine 1 so that the current feed to the stator winding 1.21 can be stopped at the exact right time. As an alternative, the use of external sensors which can be arranged on the installation device 10, is also conceivable for detecting the position of the stator 1.2.

Figure 5:
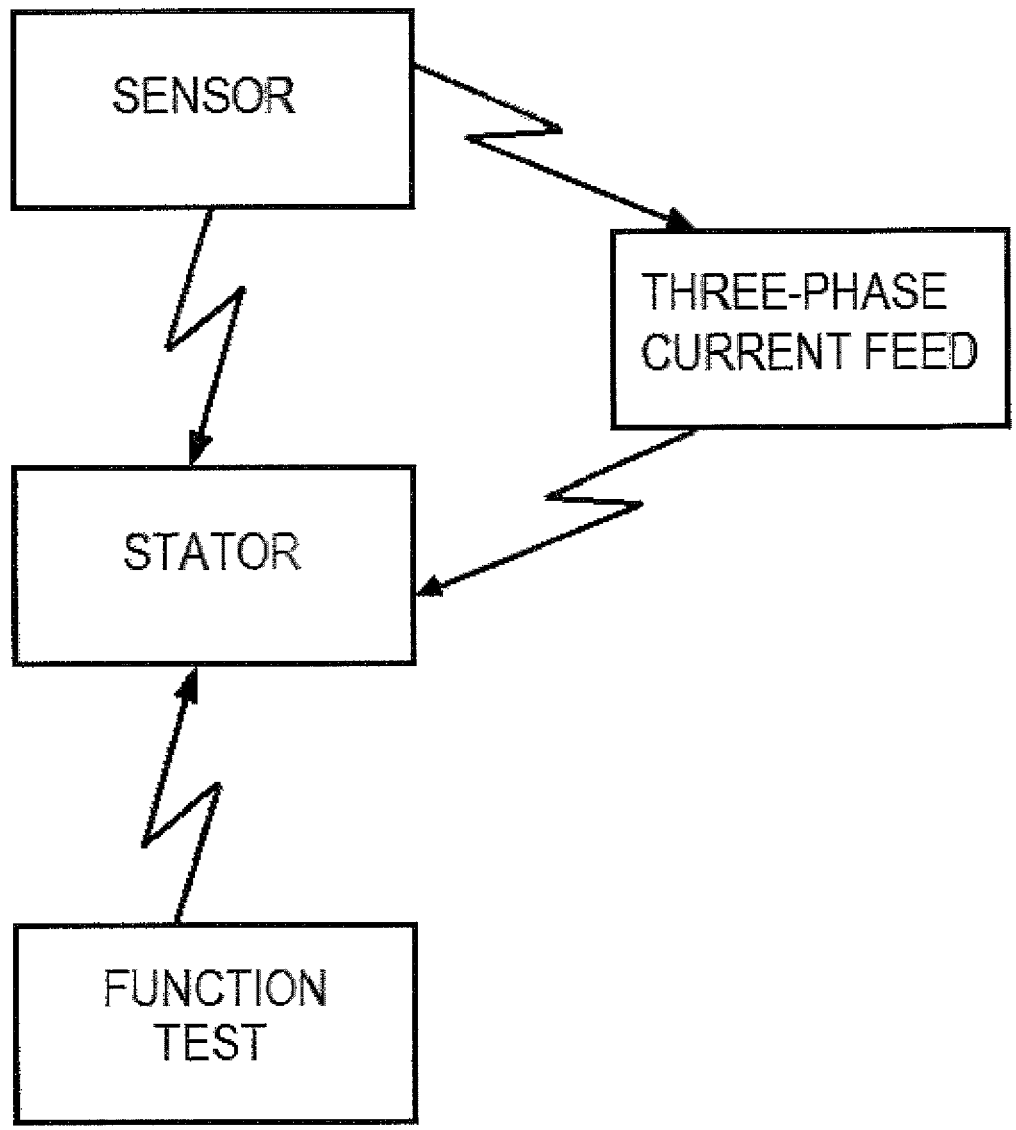
FIG. 5 is a block diagram showing a relationship between components involved in a method according to the present invention.

As the electric machine 1 is operated so as to cause a rotation of the stator 1.2 about the rotor 1.1 from the predefined installation position M1 to the further installation position M2, the electric machine 1 undergoes a function test in which the operativeness of the electric machine 1 is checked, as shown in FIG. 5. Thus, the stator 1.2 is energized for rotation to the further installation position M2 while at the same time the operativeness of the electric machine 1 is checked to execute a final installation control, in which the rotary drive, rotation direction, sensor assembly, electrical and mechanical parameter etc. of the electric machine are checked.

Further attachment parts can be mounted by repeating the steps of opening the clamping device 10.2, rotating the stator 1.2 together with the stator housing 1.20 to a further installation position, and subsequent clamping of the stator 1.2 in the further installation position, as needed.

While the invention has been illustrated and described in connection with currently preferred embodiments shown and described in detail, it is not intended to be limited to the details shown since various modifications and structural changes may be made without departing in any way from the spirit and scope of the present invention. The embodiments were chosen and described in order to explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A method of mounting attachment parts to an electric machine, said method comprising steps in a following order:
   non-rotatably supporting a rotor of the electric machine in a bearing device;
   detachably securing a stator arranged in a stator housing of the electric machine in a predefined first installation position by a clamping device, wherein the stator is secured by clamping the stator housing of the stator via the clamping device;
   mounting a first attachment part to the stator housing;
   releasing the clamping device;
   operating the electric machine as a motor while the stator together with the stator housing rotates in relation to the rotor until reaching a second installation position;
   securing the stator via the stator housing by the clamping device in the second installation position; and
   mounting a second attachment part to the stator housing, wherein the clamping device comprises laws arranged external to the stator housing.

2. The method of claim 1, further comprising checking the electric machine for operativeness, while the stator rotates about the rotor from the first installation position to the second installation position during operation of the electric machine.

3. The method of claim 1, further comprising detecting a position of the stator by position sensors of the electric machine.

4. The method of claim 1, further comprising detecting a position of the stator by position sensors located outside of the electric machine.

5. The method of claim 1, further comprising energizing a three-phase winding of the stator to operate the electric machine as the motor.

6. The method of claim 5, wherein the three-phase winding is adapted to generate a three-phase rotating field.

7. The method of claim 1, wherein the electric machine is a polyphase machine.

8. The method of claim 1, wherein the electric machine is a synchronous machine or an asynchronous machine.

9. A method of mounting attachment parts to an electric machine, said method comprising steps in a following order:

clamping a stator arranged in a stator housing in a first installation position that allows access from above by externally clamping the stator housing with jaws;

lowering a first attachment part onto the stator housing in the first installation position and mounting the attachment part to the stator housing;

releasing the stator housing from the jaws; moving the stator with the first attachment part in relation to a stationary rotor of the electric machine away from the first installation position to a second installation position which corresponds to the first installation position as occupied by the stator for mounting the first attachment part;

clamping the stator by externally clamping the stator housing with the jaws; and lowering a second attachment part onto the stator housing in the second installation position and mounting the second attachment part to the stator housing.

10. The method of claim 9, wherein the stator is moved by operating the electric machine as a motor while the stator together with the stator housing rotates in relation to the rotor until reaching the second installation position.

11. The method of claim 10, wherein the electric machine is operated as the motor by energizing a three-phase winding of the stator.

* * * * *